United States Patent [19]

Sano et al.

[11] Patent Number: 5,136,760
[45] Date of Patent: Aug. 11, 1992

[54] CLAMP STRUCTURE FOR PLURAL MEMBERS

[75] Inventors: Masaki Sano; Norimichi Takahashi; Hidetaka Yokota, all of Tokyo, Japan

[73] Assignee: Asahi Kogaku Kogyo Kabushiki Kaisha, Tokyo, Japan

[21] Appl. No.: 684,814

[22] Filed: Apr. 15, 1991

[30] Foreign Application Priority Data

Apr. 23, 1990 [JP] Japan ............................. 2-43887[U]

[51] Int. Cl.$^5$ .............................................. A44B 21/00
[52] U.S. Cl. ....................................... 24/457; 24/459; 403/409.1
[58] Field of Search ................. 24/457, 458, 522, 289, 24/295, 459, 460, 461; 248/231.8, 316.7; 403/409.1, 374

[56] References Cited

U.S. PATENT DOCUMENTS

| | | | |
|---|---|---|---|
| 939,933 | 11/1909 | Trautner | 403/374 X |
| 1,332,442 | 3/1920 | Kane | 24/460 |
| 2,540,781 | 2/1951 | Glitsch | 24/459 |
| 2,675,593 | 4/1954 | Okell | 24/522 X |
| 3,757,031 | 9/1973 | Izraeli | 24/459 X |

Primary Examiner—James R. Brittain
Attorney, Agent, or Firm—Sandler, Greenblum, & Bernstein

[57] ABSTRACT

A clamp structure clamps superimposed circuit boards to a support plate portion of a rangefinder case in a still camera. The clamp structure includes first and second support arms spaced in confronting relation from each other by a distance greater than the thicknesses of the superimposed circuit boards and the support plate portion. The first and second support arms are disposed in sandwiching relation to the circuit boards and the support plate portion. A rod is inserted in a space defined between the second support arm and the lowermost circuit board which faces the second support arm while the first support arm is being held against the uppermost circuit board which faces the first support arm. With the rod inserted in the space, the circuit boards are fastened to the support plate portion between the first and second support arms under the resiliency of either an elastic member which is placed between the first support arm and the uppermost circuit board or the resiliency of the first and second support arms themselves.

9 Claims, 4 Drawing Sheets

CLAMP STRUCTURE FOR PLURAL MEMBERS

The present disclosure relates to subject matter contained in Japanese Utility Model Application No. 2-43887 (filed on Apr. 23, 1990) which is expressly incorporated hereby by reference in its entirety.

BACKGROUND OF THE INVENTION

1. Field of the Invention

The present invention relates to a clamp structure for clamping a plurality of members together.

2. Description of the Relevant Art

Clips are typically used to clamp a plurality of superimposed members together or to fasten one or more plate-like members to another member in various devices and apparatus For example, to connect terminals of two circuit boards, the circuit boards are superimposed on each other or clamped or fastened to a certain support member by a clip which is made of an elastic material such as spring steel and having two confronting support legs.

The two support legs of the clip are spaced from each other by a distance which is smaller than the sum of the thicknesses of the circuit boards, or the circuit boards and the support member. To clamp the circuit boards on the support member, the two support legs of the clip are forcibly spread apart from each other and then brought into engagement with the circuit boards and the support member, thereby gripping the circuit boards and the support member together under the bias of the support legs. The conventional clip is disadvantageous in that it is awkward to forcibly spread the confronting support legs apart from each other.

In the case where the clip is made of steel, the clip is pressed to obtain its shape, but it is difficult to achieve the desired dimension between the support legs with high accuracy according to the pressing process. Accordingly, difficulty has been experienced in properly obtaining desired clamping forces from the clip to fasten the circuit boards together or to the support member.

SUMMARY OF THE INVENTION

It is an object of the present invention to provide a clamp structure for clamping a plurality of members, which eliminates the aforesaid shortcomings of the conventional clip.

Another object of the present invention is to provide a clamp structure which can clamp a plurality of members together through a simple procedure and which can clamp a plurality of members together under desired clamping forces.

To achieve the above objects, there is provided, in accordance with the present invention, a clamp structure for clamping superimposed plate-like portions of a plurality of members. The clamp structure comprises a clamp member having first and second support arms spaced in confronting relation from each other by a distance greater than the thicknesses of the superimposed plate-like portions, and disposed in sandwiching relation to the superimposed plate-like portions: a rod insertable in a space defined between the second support arm and one of the superimposed plate-like portions which faces the second support arm while the first support arm is being held against one of the superimposed plate-like portions which faces the first support arm: and elastic means for elastically fastening the superimposed plate-like portions between the first and second support arms while the superimposed plate-like portions are being positioned between the first and second support arms with the rod inserted in the space.

To clamp the plurality of members, the first and second support arms are positioned in sandwiching relation to the superimposed plate-like portions, and the rod is inserted into the space between the second support plate and one of the superimposed plate-like portions which faces the second support arm.

Even if the clamp member comprises a pressed member, and the distance between the first and second support arms differs from a desired dimension due to an error, clamping forces for fastening the plurality of members may be set to a desired value by selecting a suitable rod having different cross-sectional areas or diameters.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

The principles of the present invention may be incorporated in various devices and apparatus in which a plurality of members are required to be clamped together or fastened to another member. In the illustrated embodiment, however, the present invention is applied to a clamp structure for clamping circuit boards to a member in a camera.

Figure 1:
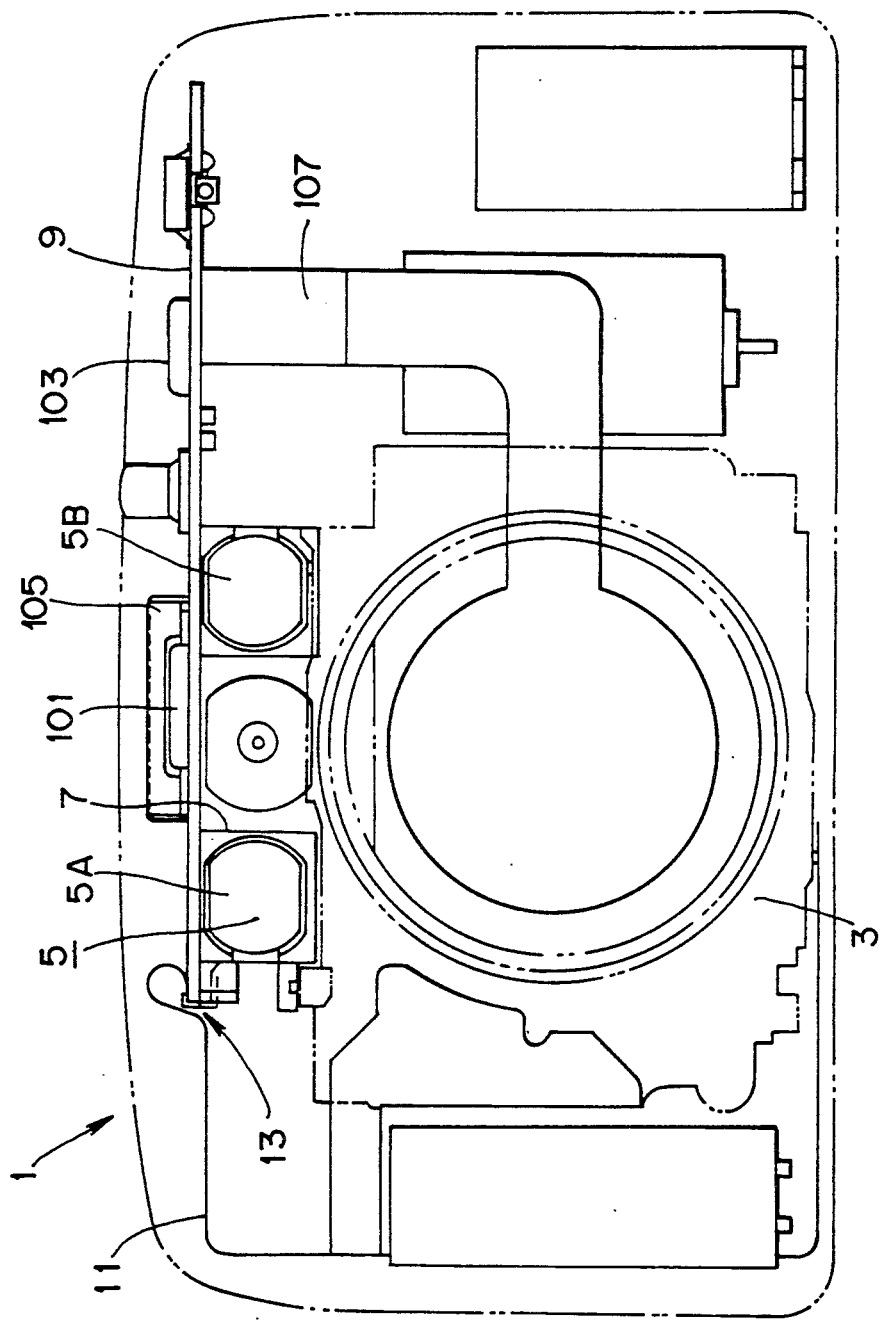
FIG. 1 is a schematic front elevational view of a camera.

As shown in FIG. 1, a camera 1 includes a lens barrel 3 mounted on a camera housing and a rangefinder unit 5 mounted in the camera housing above the lens barrel 3. The rangefinder unit 5 comprises a light-emitting element 5A and a light-detecting element 5B which are housed in a case 7. The camera 1 also includes an electronic control system for controlling various operations of the camera. The electronic control system has a rigid circuit board 9 disposed on the case 7 and a flexible circuit board 11 which has one end attached to an end of the circuit board 9.

The rigid circuit board 9 supports thereon an IC 101 as a CPU for controlling the camera 1 for its entire operation, an IC 103 for controlling a zooming motor and a film winding motor, and a liquid crystal display 105. To the circuit board 9, there is connected a connector board 107 which is connected to a shutter charging motor which is disposed in the camera housing near the lens barrel 3.

The flexible circuit board 11 has a wiring pattern which connects a DX terminal, a zooming switch, and a shutter release switch to the circuit board 9.

The circuit boards 9, 11 have ends disposed on and clamped to the case 7 by a clamp structure 13, according to a first embodiment of the present invention. The circuit boards 9, 11 have terminals electrically connected to each other, at their ends which are clamped together by the clamp structure 13.

The clamp structure 13 will be described in greater detail below with reference to FIGS. 2 through 5. The case 7 includes a support plate portion 701 at a lateral end thereof, and the ends of the circuit boards 9, 11 are superimposed on the support plate portion 701 and clamped thereto by the clamp structure 13.

The clamp structure 13 includes a clamp member 15 which comprises a first horizontal support arm 15A overlying the circuit board 11, a second horizontal support arm 15B underlying the support plate portion 701 of the case 7, a vertical joint arm 15C extending between and interconnecting the first and second support arms 15A, 15B, and a pair of spaced vertical legs 15D extending from opposite sides of the first support arm 15A toward the second support arm 15B. The first support arm 15A, the joint arm 15C, and the second support arm 15B substantially assume a C-shape when viewed in side elevation.

The clamp member 15 is bent from a highly rigid plate member and hence is highly resistant to deformation.

An elastic member 17 is bonded as by an adhesive to the lower surface of the first support arm 15A which faces the second support arm 15B. The elastic member 17 has a prescribed thickness and is made of electrically nonconductive rubber.

The distance between the first and second support arms 15A, 15B is larger than the sum of the thicknesses of the components to be clamped, i.e., the circuit boards 9, 11 and the support plate portion 701, so that these components can easily be placed between the first and second support arms 15A, 15B without forcibly spreading them apart.

In this embodiment, because the elastic member 17 is bonded to the lower surface of the first support arm 15A, the distance between the surface of the elastic member 17 which faces the second support arm 15B and the second support arm 15B is greater than the sum of the thickness of the support plate portion 701, the thickness of the circuit board 9, and the thickness of the circuit board 11.

The second support arm 15B has a cavity 15E defined in an upper surface thereof. Actually, the cavity 15E is formed by bending the second support arm 15B downwardly away from the support plate member 701. The support plate member 701 has a cavity 7E in its lower surface which faces the cavity 15E.

When the first and second support arms 15A, 15B are positioned in sandwiching relation to the superimposed circuit boards 9, 11 and the support plate portion 701 with the elastic member 17 held against the circuit board 11, a space 19 is created between the second support arm 15B and the support plate member 701 by the cavities 7E, 15E.

Figure 2:
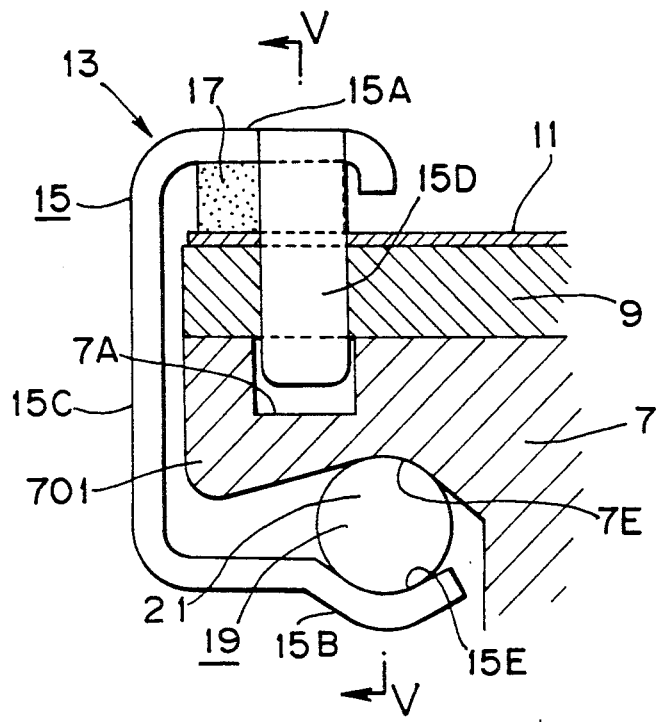
FIG. 2 is an enlarged cross-sectional view of a clamp structure according to a first embodiment of the present invention, the clamp structure being incorporated in the camera shown in FIG. 1.
Figure 3:
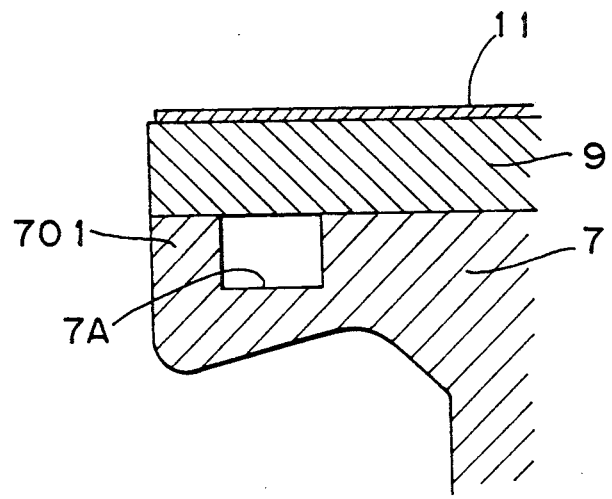
FIG. 3 is an enlarged cross-sectional view of a case of a rangefinder unit and a circuit board in the clamp structure shown in FIG. 2.
Figure 4:
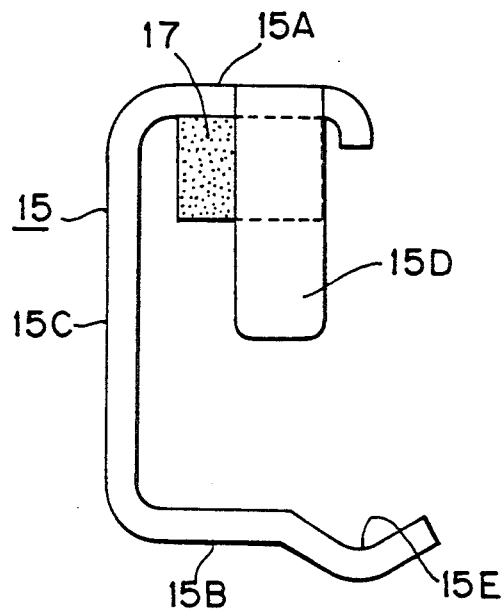
FIG. 4 is a side elevational view of a clamp member in the clamp structure shown in FIG. 2.
Figure 5:
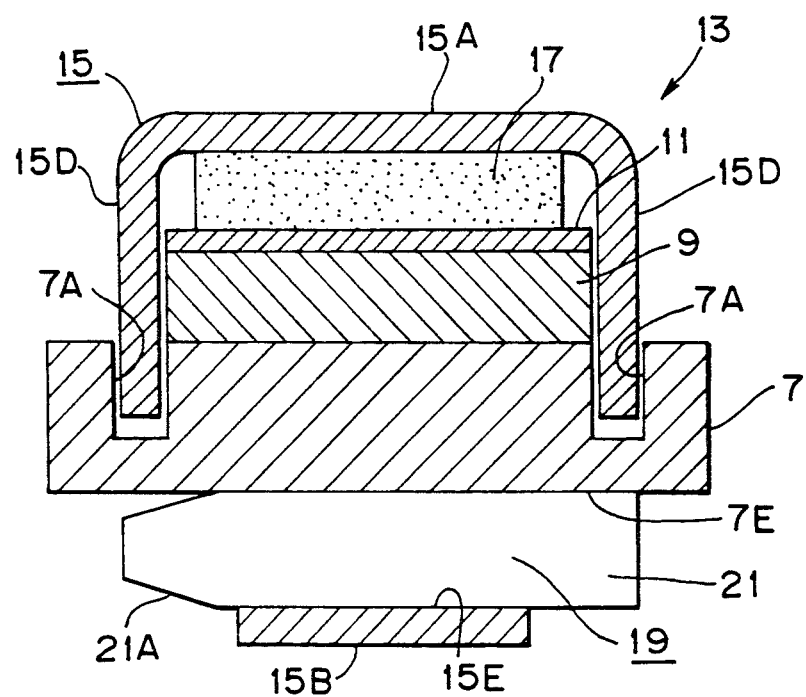
FIG. 5 is a cross-sectional view taken along line V—V of FIG. 2.

A rod 21 is inserted in the space 19 as shown in FIGS. 2 and 5. The rod 21 extends perpendicularly to the second support arm 15B in transverse relation to the circuit boards 9, 10 and the support plate portion 701. The rod 21 is of a circular cross section and has a tapered end 21A which makes it easy to insert the rod 21 into the space 19. The rod 21 is longer than the width of the second support arm 15B, so that the rod 21 can manually be gripped easily for insertion and removal.

The cross-sectional shape of the rod 21 is larger than the size of the space 19 when the superimposed circuit boards 9, 11 and the support plate portion 701 are sandwiched between the first and second support arms 15A, 15B with the elastic member 17 held against the circuit board 11. Stated otherwise, the rod 21 and the space 19 are dimensioned such that when the elastic member 17 is largely compressed by displacing the clamp member 15 downwardly from the position shown in FIGS. 2 and 5, the space 19 becomes larger than the cross-sectional shape of the rod 21, allowing the rod 21 to be removed. At the time the rod 21 is inserted in the space 21, engaging in the cavities 7E, 15E, the elastic member 17 is slightly compressed.

In this embodiment, the distance between the first and second support arms 15A, 15B is about 6 mm, whereas the rod 21 has a diameter of about 2 mm.

The legs 15D serve to prevent the circuit boards 9, 11 from being displaced with respect to the case 7 when external forces are applied to the clamp member 15 and the circuit boards 9, 11. As shown in FIG. 5, the distance between the legs 15D is selected such that the legs 15D are disposed just astride the circuit boards 9, 11 in the transverse direction thereof. The case 7 has a pair of recesses 7A defined in its upper surface for receiving the lower ends of the legs 15D, respectively.

In order to connect the terminals of the circuit boards 9, 11 and secure the circuit boards 9, 11 to the support plate portion 701, the circuit boards 9, 11 and the support plate portion 701 are sandwiched between the first and second support arms 15A, 15B. The elastic member 17 is placed beneath the first support arm 15A and on the circuit board 11. The legs 15D are positioned astride the circuit boards 9, 11, with their lower ends inserted respectively in the recesses 7A. The first support arm 15A is manually pressed downwardly to compress the elastic member 17 until the space 19 between the cavities 7E, 15E becomes large enough to allow the rod 21 to be inserted therein. Thereafter, the rod 21 is inserted into the space 19, and then the first support member 15A is released.

The tapered end 21A of the rod 21 permits the rod 21 to be inserted easily into the space 19. In addition, even if the first support arm 15A is not manually pushed downwardly, the tapered end 21A lowers the support arm 15B automatically as it is forced into the space 19. Therefore, the rod 21 may be inserted into the space 19 without the support arm 15A being manually pressed downwardly.

With the rod 21 inserted in the space 19, the second support arm 15B is displaced downwardly, pulling the first support arm 15A downwardly to compress the elastic member 17. As a result, the circuit boards 9, 11 and the support plate portion 701 are clamped together under the resilient forces of the elastic member 17, tending to restore the elastic member 17 to its original shape.

Consequently, the circuit boards 9, 11 can be clamped or released simply by inserting or removing the rod 21.

After the circuit boards 9, 11 and the support plate portion 701 are gripped between the first and second support arms 15A, 15B, the circuit boards 9, 11 are subjected to resilient forces which are applied vertically thereacross by the elastic member 17. Consequently, the circuit boards 9, 11 are not displaced relative to each other and also to the case 7.

The forces with which the circuit boards 9, 11 are clamped to the case 7 are determined by the extent to which the elastic member 17 is compressed. Therefore, even if the distance between the first and second support arms 15A, 15B is not of a desired dimension, the circuit boards 9, 11 may be clamped under suitable clamping forces by adjusting the extent to which the elastic member 17 is compressed, through the use of a rod 21 of a suitable diameter. To this end, a plurality of rods 21 of different diameters are prepared in advance, so that they are selectively available for use with the clamp member 15.

Since the circuit boards 9, 11 are pressed by the elastic member 17, even if the circuit boards 9, 11, and particularly the flexible circuit board 11, have surface irregularities, the circuit boards 9, 11 can be clamped reliably to the case 7 by the elastic member 17 whose surface is elastically deformable in conformity with those surface irregularities.

While in the illustrated embodiment the cavities 15E, 7E are defined in the second support arm 15B and the support plate portion 701, respectively, and the rod 21 is inserted in the space 19 between the cavities 15E, 7E, only one cavity may be defined in either the second support arm 15B or the case 7 should the surface of the support plate portion 701 or the surface of the second support arm 15B have a high coefficient of friction. However, both the cavities 15E, 7E defined in the second support arm 15B and the case 7, respectively, are advantageous in that the clamp member 15 can be prevented from being accidentally removed even if the surface of the support plate portion 701 or the surface of the second support arm 15B has a low coefficient of friction.

The cross-sectional shape of the rod 21 and the cross-sectional shapes of the cavities 15E, 7E are complementarily determined. For example, if the rod 21 has a square cross section, then the cavities 15E, 7E are of cross sectional shapes corresponding to the square cross section of the rod 21. In the case where the cross-sectional shape of the rod 21 is circular, as shown, the cavities 15E, 7E may be of cross-sectional shapes which are not complementary to the circular cross-sectional shape of the rod 21, so that the rod 21 contacts the surfaces of the cavities 15E, 7E through reduced areas for easy insertion and removal of the rod 21.

A clamp structure according to a second embodiment will now be described with reference to FIG. 6.

Figure 6:
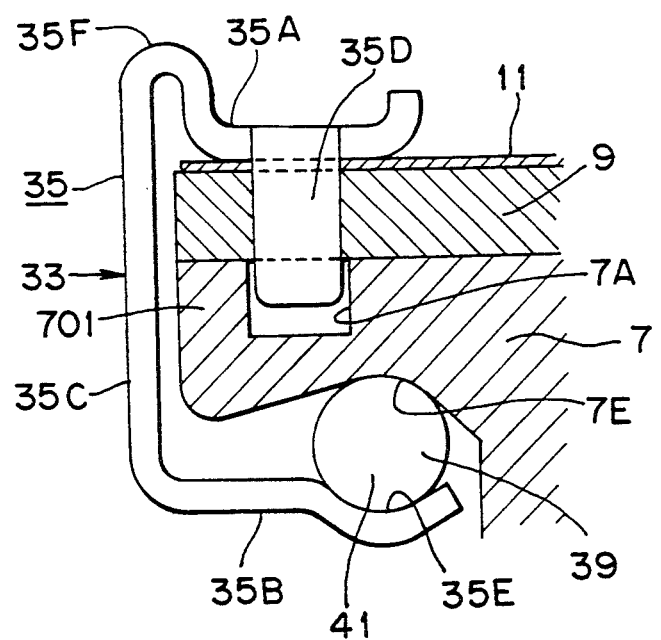
FIG. 6 is an enlarged cross-sectional view of a clamp structure according to a second embodiment of the present invention.

The clamp structure, generally designated by the reference numeral 33 in FIG. 6, differs from the clamp structure according to the first embodiment in that a clamp member 35 is made of an elastically deformable material, and no separate elastic member is employed.

More specifically, the clamp member 35 comprises a first horizontal support arm 35A placed against the circuit board 11, a second horizontal support arm 35B underlying the support plate portion 701 of the case 7, a vertical joint arm 35C extending between and interconnecting the first and second support arms 35A, 35B, and a pair of spaced vertical legs 35D extending from opposite sides of the first support arm 35A toward the second support arm 35B. The first support arm 35A includes a vertically bent member 35F which is joined to the joint arm 35C.

The clamp member 35 is bent from an elastically deformable member made of synthetic resin, spring steel, or the like.

The distance between the first and second support arms 35A, 35B is larger than the sum of the thicknesses of the circuit boards 9, 11 and the support plate portion 701.

The second support arm 35B has a cavity 35E defined in an upper surface thereof. The support plate member 701 has a cavity 7E in its lower surface which faces the cavity 35E.

When the first and second support arms 35A, 35B are positioned in sandwiching relation to the superimposed circuit boards 9, 11 and the support plate portion 701, with the first support arm 35A held against the circuit board 11, a space 39 is created between the second support arm 35B and the support plate member 701 by the cavities 7E, 35E. A rod 41 of a circular cross section is then inserted in the space 39.

The cross-sectional shape of the rod 41 is larger than the size of the space 39 when the superimposed circuit boards 9, 11 and the support plate portion 701 are sandwiched between the first and second support arms 35A, 35B with the first support arm 35A held against the circuit board 11. Stated otherwise, when the rod 41 and the space 39 are dimensioned such that when the rod 41 is inserted in the space 39, engaging in the cavities 7E, 35E, the bent member 35F or the second support arm 35B or both are elastically deformed downwardly.

The legs 35D serve to prevent the circuit boards 9, 11 from being displaced with respect to the case 7 when external forces are applied to the clamp member 35 and the circuit boards 9, 11. The distance between the legs 35D is selected such that the legs 35D are disposed just astride the circuit boards 9, 11 in the transverse direction thereof. The lower ends of the legs 35D are received respectively in the recesses 7A in the case 7.

In the second embodiment, upon insertion of the rod 41 into the space 35, the clamp member 35 is elastically deformed, and the circuit boards 9, 11 and the support plate portion 701 are clamped together under the resilient forces of the clamp member 35 itself, tending to restore the clamp member 35 to its original shape.

Therefore, the circuit boards 9, 11 can be clamped or released simply by inserting or removing the rod 41. The extent to which the clamp member 35 is elastically deformed may be adjusted by using a rod 41 of a suitable diameter. Consequently, the circuit boards 9, 11 can be clamped under desired clamping forces at all times.

In the first and second embodiments, the clamp members 15, 35 are used to clamp the circuit boards 9, 10 to the case 7. However, the clamp members 15, 35 may also be used to clamp a plurality of circuit boards together.

The clamp structure according to the present invention may be employed to clamp a plurality of members other than plates or sheets. In such a case, plate members are attached to all or some of the members to be clamped, and these plate members are clamped by the clamp member of the present invention. The clamp member and the rod which are used to clamp such members may have suitable size and diameter depending on the size of the members to be clamped.

Although certain preferred embodiments have been shown and described, it should be understood that many changes and modifications may be made therein without departing from the scope of the appended claims.

We claim:

1. A clamp structure for clamping superimposed plate-like portions of a plurality of members, comprising:

a clamp member having first and second support arms spaced in confronting relation from each other by a distance greater than the thickness of the superimposed plate-like portions, and disposed in sandwiching relation to said superimposed plate-like portions;

a rod insertable in a space defined between said second support arm and one of said superimposed plate-like portions which faces said second support arm while said first support arm is being held against one of said superimposed plate-like portions which faces said first support arm, said rod including an engaging portion for engaging said second support arm, said engaging portion of said rod having a uniform circular cross section; and elastic means for elastically fastening said superimposed plate-like portions between said first and second support arms while said superimposed plate-like portions are being positioned between said first and second support arms with said rod inserted in said space.

2. A clamp structure according to claim 1, wherein said second support arm includes a first cavity, said rod engaging in said first cavity when the rod is inserted in said space.

3. A clamp structure according to claim 2, in combination with said superimposed plate-like portions of a plurality of members, wherein said one of the superimposed plate-like portions which faces said second support arm includes a second cavity which confronts said first cavity, said rod engaging in said first and second cavities.

4. A clamp structure according to claim 1, wherein said clamp member is made of a highly rigid material, said elastic means comprising an elastic member disposed between said first support member and said one of the superimposed plate-like portions which faces said first support arm.

5. A clamp structure according to claim 1, wherein said clamp member is made of an elastic material, said first and second support arms jointly serving as said elastic means.

6. A clamp structure according to claim 1, wherein said clamp further includes a pair of legs extending from opposite sides of said first support arm toward said second support arm, said legs being spaced apart from each other so as to be able to straddle the superimposed plate-like portions in a direction along said rod.

7. A clamp surface according to claim 6, in combination with said superimposed plate-like portions of a plurality of members, said legs being spaced apart from each other by a distance corresponding to the width of said superimposed plate-like portions in a direction along said rod.

8. A clamp structure according to claim 1, wherein said rod has a tapered end portion adjacent said engaging portion.

9. A clamp structure according to claim 1, in combination with said superimposed plate-like portions of a plurality of members, wherein said plurality of members are circuit boards.

* * * * *